(12) United States Patent
Lee et al.

(10) Patent No.: US 8,581,281 B2
(45) Date of Patent: Nov. 12, 2013

(54) ORGANIC LIGHT EMITTING DISPLAY DEVICE AND METHOD FOR FABRICATING THE SAME

(75) Inventors: Jong-Kyun Lee, Gyeonggi-do (KR); Choong-Keun Yoo, Incheon (KR)

(73) Assignee: LG Display Co., Ltd., Seoul (KR)

( * ) Notice: Subject to any disclaimer, the term of this patent is extended or adjusted under 35 U.S.C. 154(b) by 486 days.

(21) Appl. No.: 12/647,907

(22) Filed: Dec. 28, 2009

(65) Prior Publication Data

US 2010/0244070 A1    Sep. 30, 2010

(30) Foreign Application Priority Data

Mar. 24, 2009  (KR) .................. 10-2009-0024779

(51) Int. Cl.
*H01L 33/00*    (2010.01)

(52) U.S. Cl.
USPC ............... 257/98; 257/E51.018; 438/29

(58) Field of Classification Search
USPC ............... 257/98, E51.018; 438/29
See application file for complete search history.

(56) References Cited

U.S. PATENT DOCUMENTS 7,265,391 B2 *   9/2007  Yamazaki et al. .............. 257/88
2008/0284323 A1 * 11/2008  Kashiwabara et al. ....... 313/504

\* cited by examiner

*Primary Examiner* — Shaun Campbell
(74) *Attorney, Agent, or Firm* — Morgan, Lewis & Bockius LLP

(57) ABSTRACT

A method of fabricating an organic light emitting display device includes forming a first electrode in both a luminescent region and a part of a non-luminescent region, forming a buffer layer in the non-luminescent region, forming an insulation pattern on the buffer layer in the non-luminescent region, forming an auxiliary electrode on the insulation pattern in the non-luminescent region, forming an organic emission layer in both the luminescent region and the non-luminescent region, forming a second electrode in both the luminescent region and the non-luminescent region, and applying over-voltage to the auxiliary electrode, the organic emission layer on the auxiliary electrode and the second electrode.

12 Claims, 6 Drawing Sheets

ORGANIC LIGHT EMITTING DISPLAY DEVICE AND METHOD FOR FABRICATING THE SAME

This application claims the benefit of Korean Patent Application No. 10-2009-0024779, filed on Mar. 24, 2009, which is hereby incorporated by reference as if fully set forth herein.

BACKGROUND OF THE INVENTION

1. Field of the Invention

The present invention relates to an organic light emitting display device and a method for fabrication of the same and, more particularly, to an organic light emitting display device with improved lifespan and luminance and a method for fabrication thereof.

2. Discussion of the Related Art

For an image display apparatus embodying a variety of information on a screen as an important technique in advanced information and communication, there is continuous progress in development of thin, light-weight and/or portable apparatuses with improved performance. With progress towards an advanced information society, there is a need for development of various display devices and, especially, a liquid crystal display (LCD), a plasma display panel (PDP), an electro luminescent display (ELD), a field emission display (FED), a vacuum fluorescent display (VFD), and the like are recently under active investigation and development. Among these, an organic light emitting display device is a flat display device with reduced weight and volume to eliminate weight and volume problems of a cathode ray tube (CRT) and controls a light emission amount of an organic emission layer so as to display an image and, therefore, draws remarkable attention in the related art.

An organic light emitting display device is a self-luminescent device using a thin light emission film between electrodes and may be manufactured into a thin product in a sheet form. An active matrix type organic light emitting display device (AMOLED) includes pixels composed of three color (R, G, B) sub-pixels formed in a matrix form to display an image.

Each of the sub-pixels may have an organic light emitting device (hereinafter, referred to as "OLED") and a cell driving part independently driving the OLED. The cell driving part may have at least two thin film transistors and a storage capacitor in order to adjust an amount of current provided to the organic light emitting display device according to data signals, so as to control brightness of the organic light emitting display device.

A conventional OLED includes a cathode, an organic emission layer and an anode and, for a top emission type OLED, the cathode or anode composed of a transparent conductive layer is formed at a light emitting side. Here, the cathode or the anode at the light emitting side is placed over bottom layers. The cathode or anode composed of the transparent conductive layer has considerably high resistivity which in turn causes a voltage drop, that is, IR drop.

In particular, for a large screen, an area of the cathode or anode is also enlarged to increase a resistivity of the cathode or anode, thereby causing a significant IR drop in a length direction as shown in FIG. 1. Consequently, a display device with a cathode or anode composed of a transparent conductive layer aligned on a front side entails non-uniformity in luminance so that reliability of the display device is reduced.

SUMMARY OF THE INVENTION

Accordingly, the present invention is directed to solving the problems described above, and an object of the present invention is to provide an organic light emitting display device with a uniform luminance and a method for fabrication of the same.

To achieve this object and other advantages and in accordance with the purpose of the invention, there is provided an organic light emitting display device, including: at least one sub-pixel driving part formed in a non-luminescent region of a bottom substrate wherein the bottom substrate defined of the non-luminescent region and a luminescent region; a first electrode electrically connected to the sub-pixel driving part; a buffer layer placed on the first electrode in the non-luminescent region to separate an OLED into sub-pixel units; an insulation pattern formed on the buffer layer in the non-luminescent region; an auxiliary electrode formed on the insulation pattern in the non-luminescent region; an organic emission layer placed on the first electrode in the luminescent region and on the auxiliary electrode in the non-luminescent region; and a second electrode formed on the bottom substrate on which the auxiliary electrode and the organic emission layer are positioned.

Here, the auxiliary electrode may be composed of a material with less resistance than another material used for the second electrode. A thickness of the auxiliary electrode is substantially the same as that of the second electrode while a width of the auxiliary electrode may be equal to or less than that of the buffer layer.

A thickness of the insulation pattern is two times a thickness of the organic emission layer while an area of the insulation pattern may be equal to or less than that of the auxiliary electrode.

The auxiliary electrode in the non-luminescent region, the organic emission layer on the auxiliary electrode, and the second electrode on the organic emission layer have resistive properties while the first electrode in the luminescent region, the organic emission layer on the first electrode, and the second electrode on the organic emission layer have diode characteristics.

The inventive organic light emitting display device may further include a passivation layer formed all over the second electrode.

A method for fabrication of an organic light emitting display device according to the present invention includes: forming a first electrode in a part of a non-luminescent region and a luminescent region of a bottom substrate defined of the non-luminescent region and the luminescent region; forming a buffer layer in the non-luminescent region of the bottom substrate on which the first electrode is partially positioned; forming an insulation pattern on the buffer layer in the non-luminescent region; forming an auxiliary electrode on the insulation pattern in the non-luminescent region; forming an organic emission layer in both the luminescent region and the non-luminescent region of the bottom substrate on which the auxiliary electrode is positioned; forming a second electrode in both the luminescent region and the non-luminescent region of the bottom substrate on which the organic emission layer is positioned; and applying over-voltage to the auxiliary electrode, the organic emission layer on the auxiliary electrode and the second electrode.

Using the insulation pattern, the organic emission layer is separated into the one formed on the auxiliary electrode in the non-luminescent region, and the other formed on both the buffer layer and the first electrode.

Applying the over-voltage, the auxiliary electrode in the non-luminescent region, the organic emission layer on the auxiliary electrode and the second electrode on the organic emission layer may have resistive properties. On the other hand, the first electrode in the luminescent region, the organic emission layer on the first electrode and the second electrode on the organic emission layer may have diode characteristics.

As is apparent from the above disclosure, the present invention may adopt an auxiliary electrode with reduced specific resistance so as to prevent IR drop of a transparent electrode layer and to achieve a uniform luminance of a display device.

In addition, the present invention may prevent deterioration of a light emitting device, thereby enhancing a lifespan and reliability of an organic light emitting display device.

It is to be understood that both the foregoing general description and the following detailed description of the present invention are exemplary and explanatory and are intended to concretely describe the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Hereinafter, an organic light emitting display device and a method for fabricating the same according to the present invention will be described in detail from the following description with reference to exemplary embodiments, taken in conjunction with the accompanying drawings.

Figure 1:
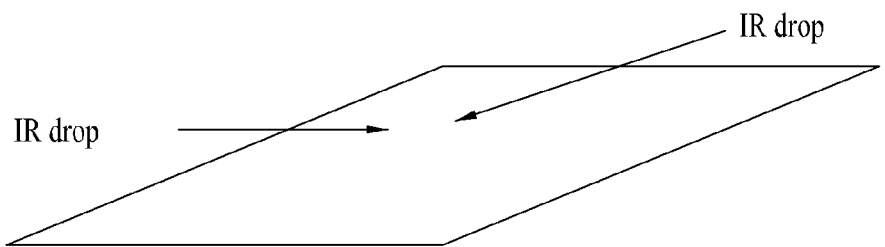
FIG. 1 depicts generation of IR drop according to a conventional technology.
Figure 2:
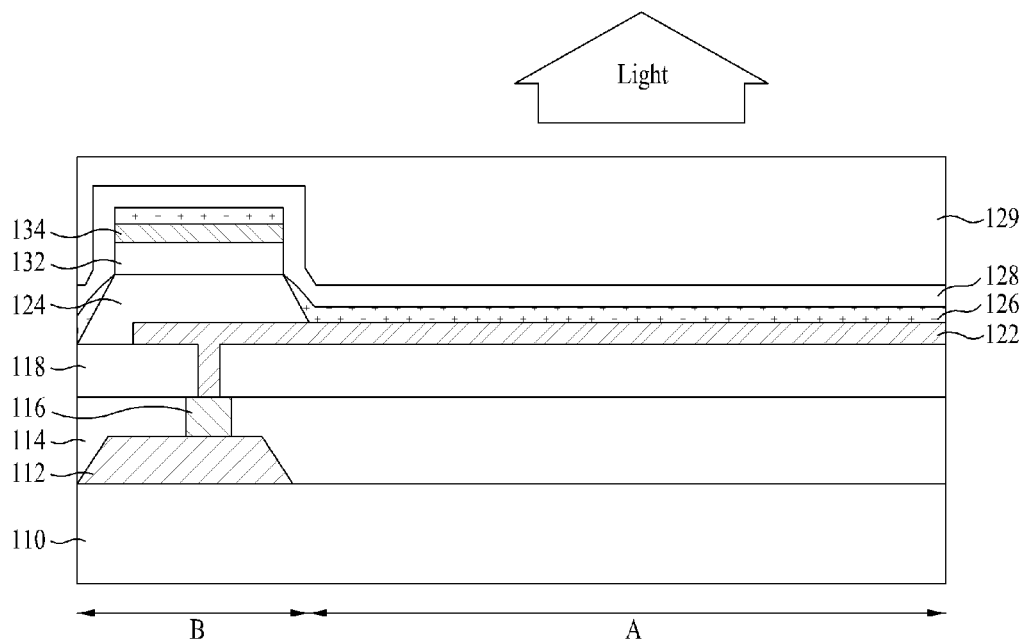
FIG. 2 is a cross-sectional view illustrating an organic light emitting display device according to the present invention.

FIG. 2 is a cross-sectional view illustrating an organic light emitting display device according to an exemplary embodiment of the present invention.

The inventive display device may comprise a sub-pixel driving part formed on a bottom substrate 110 defiend of a luminescent region A and a non-luminescent region B configured therein, an OLED, and a buffer layer 124 defining a sub-pixel.

The sub-pixel driving part formed on the bottom substrate 110 comprises a number of signal lines, a thin film transistor, and protective films 114 and 118. The sub-pixel driving part is formed in each of sub-pixels and primarily includes a switching transistor (not shown), a driving transistor 112 and a storage capacitor (not shown).

The switching transistor responds to a scan signal of a gate line in order to provide a data signal of a data line to the driving transistor 112. The driving transistor 112 responds to the data signal transferred from the switching transistor in order to control an amount of current flowing in the OLED through a connection electrode 116. The storage capacitor enables a continuous flow of current through the driving transistor 112 even when the switching transistor is off.

The driving transistor 112 is formed in the non-luminescent region B of the bottom substrate 110 and comprises a gate electrode, a semiconductor layer overlapped with the gate electrode by interposing a gate insulation film therebetween, and a source electrode and a drain electrode using the semiconductor layer as a channel. The driving transistor 112 is electrically connected to the OLED, that is, a first electrode 122 of the OLED via the connection electrode 116.

The OLED may include the first electrode 122 connected to the driving transistor 112, an organic emission layer 126, a second electrode 128, an insulation pattern 132 and an auxiliary electrode 134.

The first electrode 122 is positioned on a protection film 118 in both the luminescent region A and the non-luminescent region B in order to be coupled to the connection electrode 116 via a contact hole formed in the protection film 118. In this case, the first electrode 122 is spaced at a certain interval in the non-luminescent region B in order to prevent the first electrode 122 from coming into contact with another first electrode of an adjacent sub-pixel.

The first electrode 122 may be made of Cr, Al, AlNd, Mo, Cu, W, Au, Ni, Ag, alloys and/or oxides thereof and, in addition, may be fabricated in a multilayer form. The first electrode 122 is a cathode or an anode, electrically connected to the driving transistor 112 via the connection electrode 116.

The organic emission layer 126 is a layer emitting light when an exciton formed by combination of an electron hole with an electron injected from the first and second electrodes 122 and 128, respectively, falls to the ground state. Such an organic emission layer 126 may include, for example, a hole injection layer (HIL), a hole transporting layer (HTL), an emission layer (EML), an electron transporting layer (ETL), an electron injection layer (EIL), etc.

The organic emission layer 126 is formed on a buffer layer 124 in the luminescent region A, upper portion of an auxiliary electrode 134, and the first electrode 122 in the non-luminescent region B. Here, the organic emission layer 126 is separated into sub-pixel units by the buffer layer 124 and may emit R, G and B light in sub-pixel units to display an image.

The second electrode 128 as a cathode or an anode for injecting electron holes has a high work function and is comprised of a transparent conductive layer to pass light emitted from the organic emission layer 126 out of the device. The transparent conductive layer may be formed using indium tin oxide (ITO), tin oxide (TO), indium zinc oxide (IZO), indium tin zinc oxide (ITZO) or a combination thereof. The second electrode 128 is provided in a plate form and is formed all over both the luminescent region A and the non-luminescent region B. The auxiliary electrode 134 and the insulation pattern 132 are provided in order to prevent IR drop of the second electrode 128 formed of transparent conductive layer.

The auxiliary electrode 134 compensates resistive components of the second electrode 128 composed of the transparent conductive layer. The auxiliary electrode 134 is formed with the same thickness as the second electrode 128 on the insulation pattern 132 between the second electrode 128 and the buffer layer 124 in the non-luminescent region B.

The auxiliary electrode 134 reduces a difference in electric resistivity of the second electrode 128 and, therefore, may be prepared using a conductive material with less resistance than that of the second electrode 128. The auxiliary electrode 134 may also be formed using any conductive material used for various wirings formed in the sub-pixel driving part. Such conductive materials may include, for example, molybdenum (Mo), chromium (Cr), copper (Cu), etc. As one wiring material, aluminum (Al) has strong oxidative properties and is preferably excluded in view of reliability of a display device.

With increased width of the auxiliary electrode 134, the second electrode 128 may have reduced resistivity, however, may influence an aperture ratio of a display device. Accordingly, a width (cross) of the auxiliary electrode 134 is preferably equal to or less than that of the buffer layer 124. As such, the auxiliary electrode 134 formed in the non-luminescent region B may improve IR drop of the second electrode 128 without affecting the aperture ratio, thereby attaining uniform luminance.

When the auxiliary electrode 134 is positioned below the organic emission layer 126 in the non-luminescent region B, the OLED may not encounter disadvantages such as deterioration in performance or shortened lifespan caused by damage of the organic emission layer 126 during an etching process to form the auxiliary electrode 134.

In order to inhibit contact of the auxiliary electrode 134 with the organic emission layer 126 on the buffer layer 124, the insulation pattern 132 is formed below the auxiliary electrode 134. The insulation pattern 132 has an area substantially equal to or less than that of the auxiliary electrode 134 and is twice as thick as the organic emission layer 126.

Accordingly, the insulation pattern 132 may prevent contact of the organic emission layer 126 formed on the buffer layer 124 with the auxiliary electrode 134, which in turn inhibits current flow from the auxiliary electrode 134 through the organic emission layer to the first electrode 122 directly. As a result, deterioration of the OLED may be prevented, thus extending a lifespan thereof. Meanwhile, such an insulation pattern 132 may be at least one selected from inorganic insulation pattern, organic insulation pattern and a combination thereof as a laminate pattern form.

The buffer layer 132 serves to separate the OLED into sub-pixel units and is formed on both the first electrode 122 and the protection film 118 in the non-luminescent region B.

The auxiliary electrode 134 in the non-luminescent region B of the OLED, the organic emission layer 126 on the auxiliary electrode 134, and the second electrode 128 on the organic emission layer 126 have resistive properties. On the other hand, the first electrode 122 in the luminescent region A, the organic emission layer 126 on the first electrode 122, and the second electrode 128 on the organic emission layer 126 exhibit diode characteristics.

Therefore, current of the OLED sequentially passes the auxiliary electrode 134, the organic emission layer 126 on the auxiliary electrode 134, the second electrode 128, the organic emission layer 126 in the luminescent region A and the first electrode 122, or vice versa. The foregoing OLED emits light toward the second electrode 128 by a drive current from the driving transistor 112.

The following description will be given of a method for fabrication of an organic light emitting display device shown in FIG. 2 according to the present invention, with reference to FIGS. 3A to 3H.

Figure 3A:
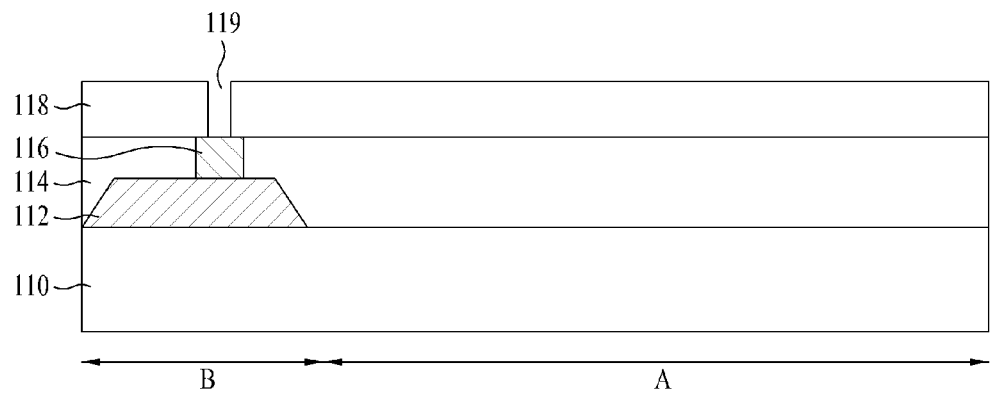
FIGS. 3A to 3H are cross-sectional views illustrating a process for fabrication of the organic light emitting display device shown in FIG. 2 according to the present invention.

Referring to FIG. 3A, a sub-pixel driving part and a connection electrode 116 connected with the sub-pixel driving part are formed on a bottom substrate 110.

More particularly, a driving transistor 112 comprising a gate electrode patterned by deposition such as sputtering, photolithography and etching, a gate insulation film, a semiconductor layer and a source electrode and a drain electrode is formed in a non-luminescent region B of the bottom substrate 110. Then, the connection electrode 116 coupled to the driving transistor in the non-luminescent region B via a contact hole in a first protection film 114 is formed. Following this, a second protection film 118 having a contact hole 119 formed to expose the connection electrode 116 is provided on the first protection film 114.

Figure 3B:
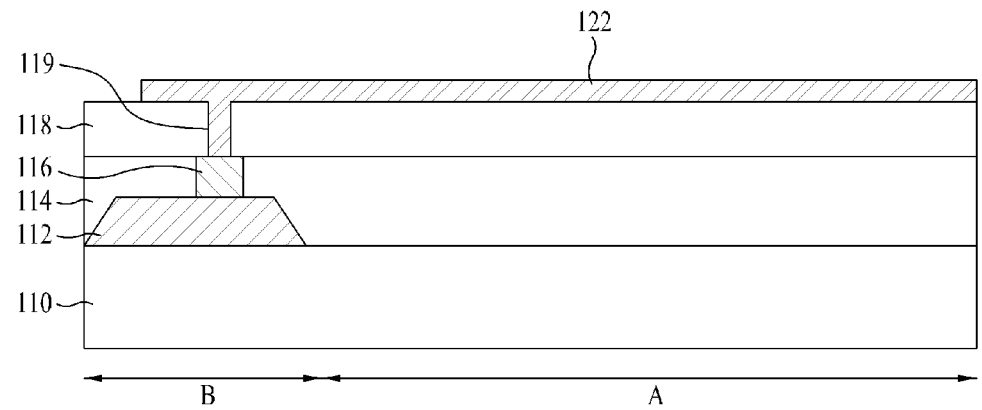

Referring to FIG. 3B, a first electrode 122 is formed on the second protection film 118 such that the first electrode 122 is coupled to the connection electrode 116 through the contact hole 119.

More particularly, the first electrode 122 is present on both the luminescent region A and the non-luminescent region B, wherein the first electrode is spaced at a certain interval in the non-luminescent region B such that the first electrode is disconnected from another first electrode of an adjacent sub-pixel. The first electrode 122 may be formed using Cr, Al, AlNd, Mo, Cu, W, Au, Ni, Ag, etc. by deposition such as sputtering or using alloys or oxides of the foregoing elements and, in addition, may be fabricated in a multilayer form. The first electrode 122 may function as a cathode or an anode.

Figure 3C:
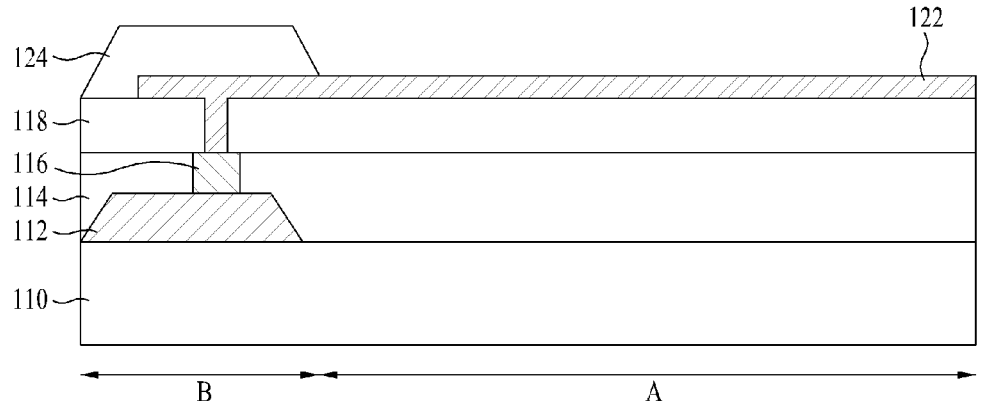

Referring to FIG. 3C, a buffer layer 124 is formed in the non-luminescent region B in order to separate the OLED into sub-pixel units.

More particularly, after forming an insulation layer (not shown) all over the bottom substrate 110 having the first electrode 122, the insulation layer is patterned by photolithography using a mask and etching so as to form the buffer layer 124 on both the first electrode 122 and the second protection film 118 in the non-luminescent region B.

Figure 3D:
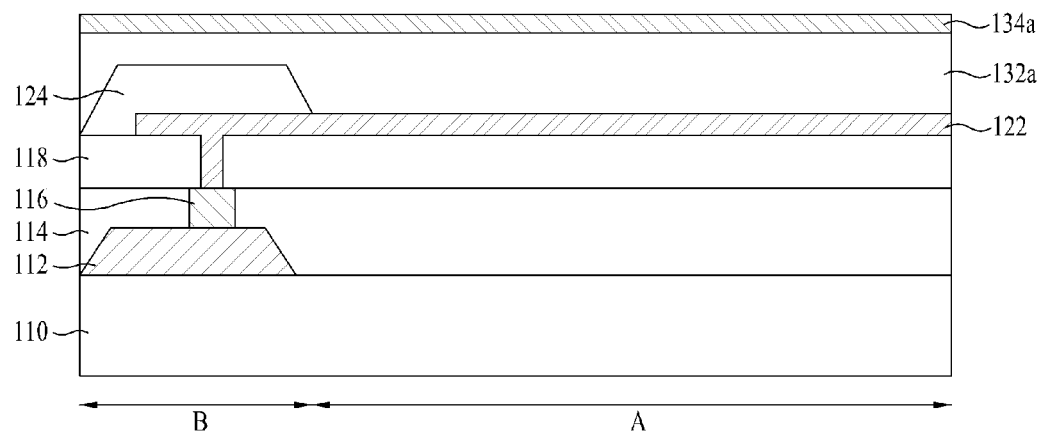
Figure 3E:
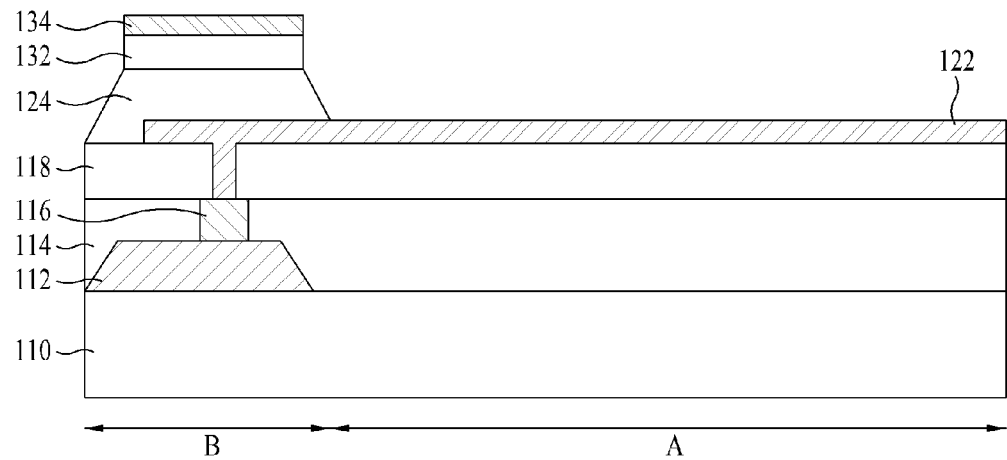

Referring to FIGS. 3D and 3E, an insulation pattern 132 and an auxiliary electrode 134 are provided on the buffer layer 124.

More particularly, an insulation material 132a and a conductive material 134a are sequentially laminated by deposition such as sputtering all over the bottom substrate 110 having the buffer layer 124.

The insulation material 132a may be any one selected from an inorganic insulation material, an organic insulation material and a laminate thereof. The conductive material 134a may be prepared using a conductive substance having less resistance than that of the second electrode to be further formed. The conductive material 134a may also be formed using any conductive substance for a variety of wirings employed in fabrication of the sub-pixel driving part. The conductive material 134a may include, for example, Mo, Cr, Cu, etc. However, as a general substance for a wiring, Al with strong oxidative properties may not be used in view of reliability of a display device.

Then, patterning the insulation material 132a and the conductive material 134a by photolithography and etching, the insulation pattern 132 and the auxiliary electrode 134 are formed on the buffer layer 124 in the non-luminescent region B. The insulation pattern 132 and the auxiliary electrode 134 may be separately patterned by individual etching processes or be concurrently patterned by a single etching process and, in consideration of processing merit, the single etching process is preferably used for concurrently patterning both the insulation pattern and the auxiliary electrode.

Here, an area of the insulation pattern 132 may be equal to or less than that of the auxiliary electrode 134. When the area of the insulation pattern 132 positioned below the auxiliary electrode 134 is less than that of the auxiliary electrode 134, direct contact of the auxiliary electrode 134 with a following organic emission layer to be formed may be favorably prevented.

The insulation pattern 132 may be twice as thick as the following organic emission layer. Increasing a width of the auxiliary electrode 134, an aperture ratio of a display device may be influenced although a resistivity of a following second electrode to be formed is reduced. Therefore, a width (cross) of the auxiliary electrode 134 may be less than or equal to that of the buffer layer 124.

Meanwhile, in order to prevent deterioration in performance of the OLED and/or shortening of a lifespan thereof which are caused by damage of the organic emission layer when the conductive material 134a is etched to form the auxiliary electrode 134, the auxiliary electrode 134 is preferably formed before preparation of the organic emission layer.

Figure 3F:
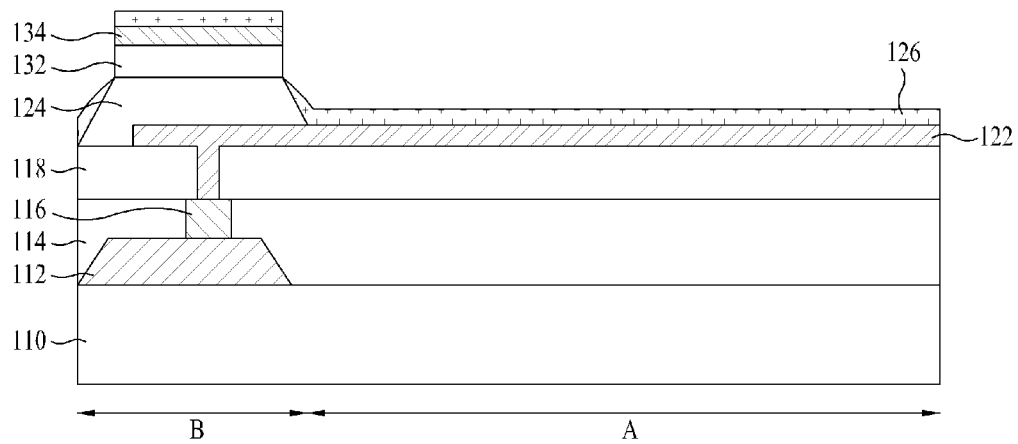

Referring to FIG. 3F, an organic emission layer 126 is formed in both the luminescent region A and the non-luminescent region B.

More particularly, an organic emission layer 126 comprising an HIL, an HTL, an EML, an ETL and an EIL is prepared as an organic laminate by deposition such as thermal deposition, and then, is provided over the auxiliary electrode 134 and the first electrode 122. The organic emission layer 126 is separated into sub-pixel units by the buffer layer 124 and may emit R, G and B light in sub-pixel units so as to display an image.

The organic emission layer 126 placed on the buffer layer 124 may be disconnected from the auxiliary electrode 134 on the insulation pattern 132 by the insulation pattern 132 that is twice as thick as the organic emission layer 126 and has an area substantially equal to that of the auxiliary electrode 134. Accordingly, it is possible to prevent an electric current from passing through the auxiliary electrode 134, the organic emission layer and the first electrode 122 in sequential order, so as to inhibit deterioration of the OLED. As a result, the lifespan of OLED may be extended.

The organic emission layer 126 on the auxiliary electrode 134 may be removed. However, since a shadow mask is necessarily used to eliminate the organic emission layer 126, production costs may increase while decreasing productivity. Therefore, in consideration of productivity, the organic emission layer 126 on the auxiliary electrode 134 may not be removed.

Figure 3G:
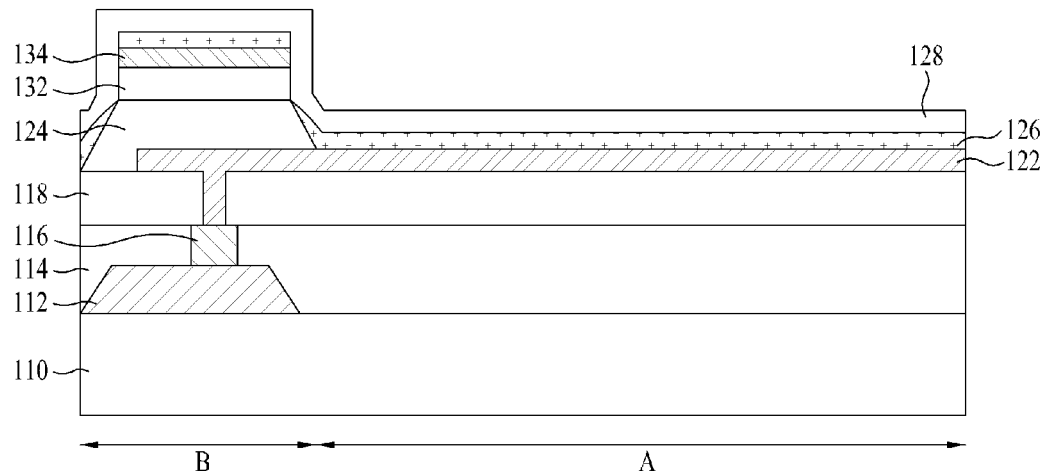

Referring to FIG. 3G, a second electrode 128 may be formed on the bottom substrate 110 having the organic emission layer 126.

More particularly, a transparent conductive layer is deposited, followed by formation of the second electrode 128 by photolithography using a mask and an etching process. The transparent conductive layer may comprise, for example, ITO, TO, IZO, ITZO or a combination thereof. The second electrode 128 may function as a cathode or an anode. For instance, when the first electrode 122 is used as a cathode, the second electrode 128 serves as an anode. On the other hand, the second electrode 128 may function as a cathode if the first electrode 122 is used as an anode.

Figure 4:
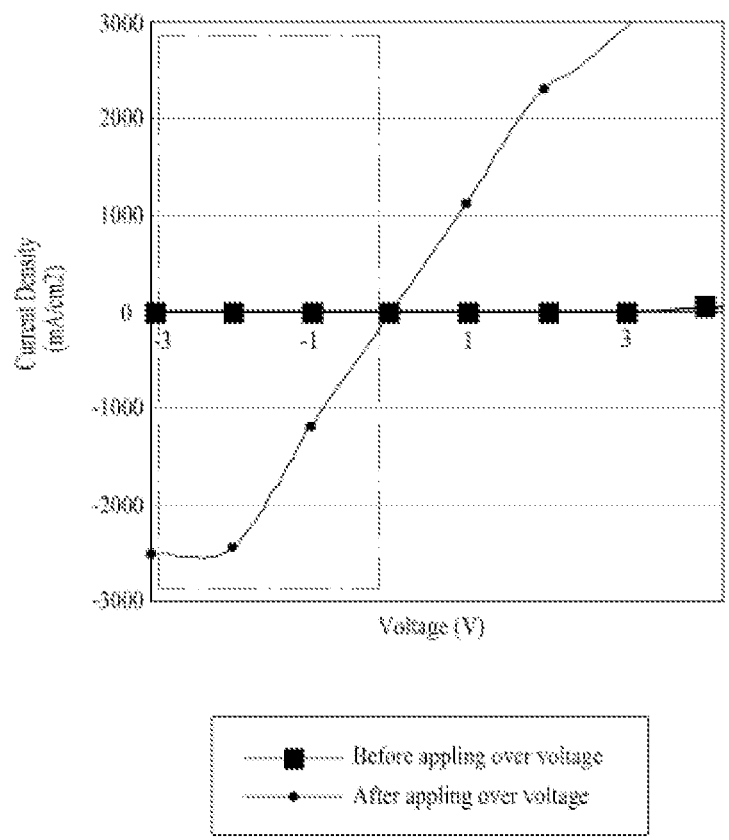
FIG. 4 depicts a graph showing current characteristics before and after applying over-voltage to a part of a non-luminescent region, on which an auxiliary electrode is positioned.

In this regard, the auxiliary electrode 134, the organic emission layer 126 on the auxiliary electrode 134, and the second electrode 128 have diode characteristics which in turn prevents current flow even when negative voltage is applied. In order to solve the above problem, over-voltage is applied to the auxiliary electrode 134, the organic emission layer 126 on the auxiliary electrode 134 and the second electrode 128 so as to change diode characteristics thereof into resistive properties. As illustrated in FIG. 4, it can be seen that the current does not flow due to diode characteristics before applying over-voltage while the diode characteristics are changed into resistive properties after applying over-voltage, thereby enable current flow.

As for the OLED formed above, the current flows from the auxiliary electrode 134 to the organic emission layer 126 on the auxiliary electrode 134, the second electrode 128, the organic emission layer 126 in the luminescent region A, and the first electrode 122 in sequential order, or vice versa. As a result, deterioration of the OLED may be prevented.

In general, an insulating layer is provided between an organic emission layer and an auxiliary electrode in order to prevent contact of the auxiliary electrode with the organic emission layer in a luminescent region. However, according to the present invention, in order to prevent contact of the auxiliary electrode 134 with the organic emission layer 126 in the luminescent region A and, at the same time, in order to utilize the organic emission layer 126 on the auxiliary electrode 134 as a resistor, the insulation pattern 132 is formed below the auxiliary electrode 134 to provide a step therebetween.

Moreover, a conventional device is fabricated using an alternative mask to form an insulating material over an auxiliary electrode. However, the present invention utilizes the same mask that was used to form the auxiliary electrode 134, in order to form the insulation pattern, thus reducing production costs.

Figure 3H:
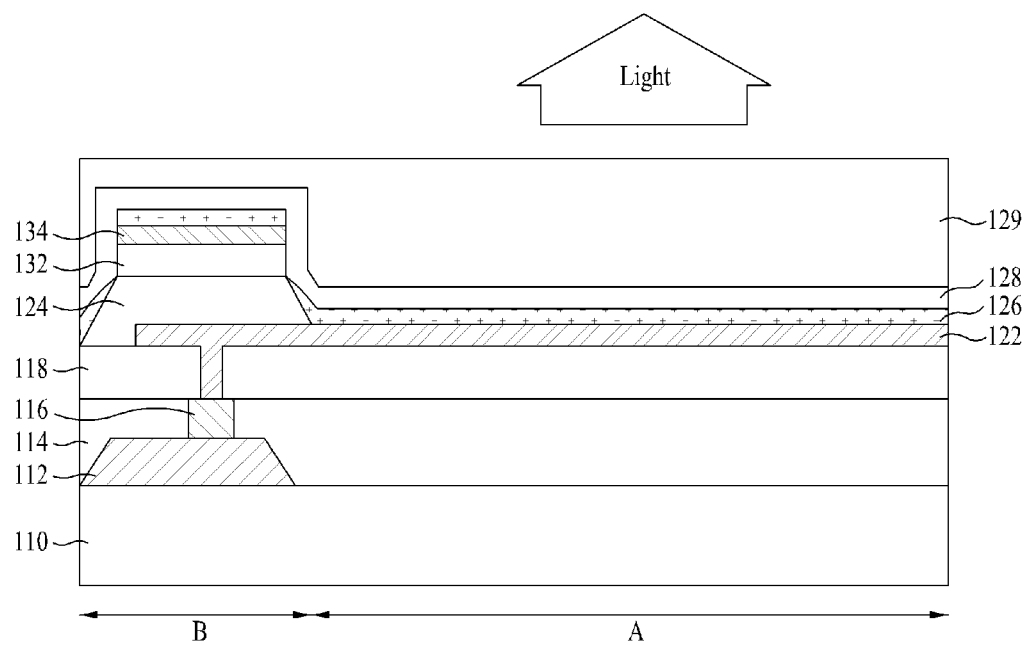

Referring to FIG. 3H, a passivation layer 129 is provided on the bottom substrate 110 having the second electrode 128, followed by further processes to complete an organic light emitting display device. Accordingly, the organic light emitting device is driven by drive current of the driving transistor 112 through the connection electrode 116, so as to emit light in a direction at which the second electrode 128 is formed.

The inventive organic light emitting display device has the auxiliary electrode 134 in the non-luminescent region B and also employs the organic emission layer 126 on the auxiliary electrode 134 and the second electrode 128 as well as the auxiliary electrode 134 in the non-luminescent region B, as resistors. Accordingly, the inventive organic light emitting display device can compensate resistive components of the second electrode 128 comprised of a transparent conductive layer which in turn prevents IR drop.

As a result, it is possible to efficiently enhance luminance of the organic light emitting display device. In addition, using the insulation pattern 132, direct contact of the auxiliary electrode 134 with the organic emission layer 126 connected to the first electrode 122 may be inhibited, so as to prevent deterioration of the OLED and to extend lifespan thereof.

Although technical constructions and other features of the present invention have been described, the present invention is not limited to the exemplary embodiments and accompanying drawings described above. It will be apparent to those skilled in the art that the present invention may cover variations and/or modifications thereof without departing from the scope of the invention defined in the appended claims.

What is claimed is:

1. An organic light emitting display device, comprising:
   at least one sub-pixel driving part formed in a non-luminescent region of a bottom substrate, wherein the bottom substrate has the non-luminescent region as well as a luminescent region configured therein;
   a first electrode electrically connected to the sub-pixel driving part;
   a buffer layer placed on the first electrode in the non-luminescent region in order to separate an organic light emitting device into sub-pixel units;
   an insulation pattern formed on the buffer layer in the non-luminescent region;
   an auxiliary electrode formed on the insulation pattern in the non-luminescent region;
   an organic emission layer placed on both of the first electrode in the luminescent region and an entire surface of the auxiliary electrode in the non-luminescent region;
   a second electrode formed on the bottom substrate on which the auxiliary electrode and the organic emission layer are positioned; and wherein the organic emission layer include at least one hole injection layer, at least one hole transporting layer, at least one emission layer, at least one electron transporting layer and at least one electron injection layer; and wherein the organic emission layer placed on the non-luminescent region is separated from the organic emission layer placed on the luminescent region.

2. The device according to claim 1, wherein the auxiliary electrode is made of a material having less resistance than that of another material used for the second electrode, and has substantially the same thickness as that of the second electrode and a width equal to or less than that of the buffer layer.

3. The device according to claim 1, wherein a thickness of the insulation pattern is two times a thickness of the organic emission layer while an area of the insulation pattern is equal to or less than that of the auxiliary electrode.

4. The device according to claim 1, wherein the auxiliary electrode in the non-luminescent region, the organic emission layer on the auxiliary electrode and the second electrode on the organic emission layer have resistive properties, while the first electrode in the luminescent region, the organic emission layer on the first electrode and the second electrode on the organic emission layer have diode characteristics.

5. The device according to claim 1, further comprising a passivation layer formed all over the second electrode.

6. A method for fabrication of an organic light emitting display device, comprising:

forming a first electrode in both a luminescent region and a part of a non-luminescent region of a bottom substrate defined of the non-luminescent region and the luminescent region;

forming a buffer layer in the non-luminescent region of the bottom substrate on which the first electrode is partially positioned;

forming an insulation pattern on the buffer layer in the non-luminescent region;

forming an auxiliary electrode on the insulation pattern in the non-luminescent region;

forming an organic emission layer in both the luminescent region and the non-luminescent region of the bottom substrate on which the auxiliary electrode is positioned;

forming a second electrode in both the luminescent region and the non-luminescent region of the bottom substrate on which the organic emission layer is positioned; and applying over-voltage to the auxiliary electrode, the organic emission layer on the auxiliary electrode and the second electrode.

7. The method according to claim 6, wherein the auxiliary electrode is made of a material having less resistance than that of another material used for the second electrode, and has substantially the same thickness as that of the second electrode and a width equal to or less than that of the buffer layer.

8. The method according to claim 6, wherein a thickness of the insulation pattern is two times a thickness of the organic emission layer while an area of the insulation pattern is equal to or less than that of the auxiliary electrode.

9. The method according to claim 6, wherein the formation of the organic emission layer is performed using the insulation pattern to separate (or isolate) the organic emission layer on the auxiliary electrode in the non-luminescent region, the buffer layer, and the organic emission layer on the first electrode, respectively.

10. The method according to claim 6, wherein as a result of applying over-voltage, the auxiliary electrode in the non-luminescent region, the organic emission layer on the auxiliary electrode and the second electrode on the organic emission layer have resistive properties, while the first electrode in the luminescent region, the organic emission layer on the first electrode and the second electrode on the organic emission layer have diode characteristics.

11. The device according to claim 1, wherein the buffer layer is formed of the same material as the insulation pattern.

12. The method according to claim 6, wherein the buffer layer is formed of the same material on the same time as the insulation pattern.

* * * * *